(12) United States Patent
Sung

(10) Patent No.: US 6,255,205 B1
(45) Date of Patent: *Jul. 3, 2001

(54) HIGH DENSITY PROGRAMMABLE READ-ONLY MEMORY EMPLOYING DOUBLE-WALL SPACERS

(75) Inventor: Kuo-Tung Sung, Hsinchu (TW)

(73) Assignee: Mosel Vitelic, Inc., Taiwan (CN)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/093,942

(22) Filed: Jun. 8, 1998

(30) Foreign Application Priority Data

Aug. 6, 1997 (TW) .................................. 86111278

(51) Int. Cl.[7] .............................................. H01C 21/8247
(52) U.S. Cl. ............................................. 438/595; 438/266
(58) Field of Search .................... 438/257–267, 438/593–594, 595–596

(56) References Cited

U.S. PATENT DOCUMENTS

| | | | |
|---|---|---|---|
| 4,403,307 | 9/1983 | Maeda | 365/174 |
| 5,066,992 | 11/1991 | Wu et al. | 357/23.5 |
| 5,120,671 | 6/1992 | Tang et al. | 437/43 |
| 5,198,691 | 3/1993 | Tarng | 257/316 |
| 5,220,533 | 6/1993 | Turner | 365/218 |
| 5,329,487 | 7/1994 | Gupta et al. | 365/185 |
| 5,364,806 | 11/1994 | Ma et al. | 437/43 |
| 5,414,693 | 5/1995 | Ma et al. | 365/185 |
| 5,430,328 | 7/1995 | Hsue | 257/750 |
| 5,440,159 | 8/1995 | Larsen et al. | 257/318 |
| 5,476,801 | 12/1995 | Keshtbod | 437/43 |
| 5,493,534 | 2/1996 | Mok | 365/226 |
| 5,587,951 | 12/1996 | Jazayeri et al. | 365/203 |
| 5,606,532 | 2/1997 | Lambrache et al. | 365/238.5 |
| 5,631,179 | * 5/1997 | Sung et al. | 438/264 |
| 5,680,346 | 10/1997 | Pathak et al. | 365/185.1 |
| 5,731,242 | * 3/1998 | Parat et al. | 438/586 |
| 5,763,312 | * 6/1998 | Jeng et al. | 438/303 |
| 6,037,223 | * 3/2000 | Su et al. | 438/257 |
| 6,077,763 | * 6/2000 | Chen et al. | 438/595 |

FOREIGN PATENT DOCUMENTS

WO 95/19047    7/1995   (WO) .................... H01L/29/68

\* cited by examiner

*Primary Examiner*—Richard Booth
(74) *Attorney, Agent, or Firm*—Townsend and Townsend and Crew, LLP

(57) ABSTRACT

The present invention provides an EPROM and a method for forming the same having increased density. The invention does so by reducing the area required for formation of a contact. Specifically, a storage cell for an electrically programmable read-only memory having a pair of spaced-apart gate structures, with a double wall spacer structure disposed on opposite sides of each gate structure.

20 Claims, 3 Drawing Sheets

HIGH DENSITY PROGRAMMABLE READ-ONLY MEMORY EMPLOYING DOUBLE-WALL SPACERS

CROSS REFERENCE TO RELATED APPLICATIONS

This application claims priority, pursuant to Title 35, United States Code §119, from Taiwanese Pat. No. 111452, issued Apr. 10, 1998, and filed on Aug. 6, 1997 as Application No. 86111278 and assigned to Mosel Vitelic, Inc. Taiwanese Pat. No. 111452 is hereby incorporated by reference in its entirety.

BACKGROUND OF THE INVENTION

The present invention relates to the field of semiconductor electronic devices and the method for manufacturing the same. More particularly, the present invention relates to a process suited for manufacturing flash erasable programmable read-only memory cells.

Erasable programmable read-only memory (EPROM) technology is well known for use in both memory and programmable logic applications. In particular, EPROMs are implemented using floating gate field effect transistors in which the binary states of the EPROM cell are represented by the presence or absence, on the floating gate, of sufficient charge to prevent conduction even when a normal high signal is applied to the gate of the EPROM transistor.

In the traditional and most basic form, EPROMs are programmed electrically and erased by exposure to ultraviolet light. These EPROMs are typically referred to as ultraviolet erasable programmable read-only memories (UVPROMs). UVPROMs are programmed by running a high current between the drain and the source of the UVEPROM transistor while applying a positive potential to the gate. The positive potential on the gate attracts energetic ("hot") electrons from the drain-to-source current, which jump onto the floating gate in an attempt to reach the gate and become trapped on the floating gate.

Another form of EPROM is the electrically erasable programmable read-only memory (EEPROM or $E^2$PROM). EEPROMs generally include two serially connected N-channel metal oxide semiconductor transistors, in which one of the transistors has an additional control gate that is floating and is sandwiched between the gate and the channel. This gate is used to store positive or negative charges which determine the state of the EEPROM. The other transistor is used for selection purposes. The charging of the floating gate is done by Fowler-Nordheim tunneling of electrons out of or into the floating gate. The oxide layer between the channel and the floating gate is around 100 Å as reported in some converted devices. These conventional EEPROM occupy large spaces due to the large capacitive coupling that is required between the floating gate and the control gate. Efforts have been made, however, to increase the density of EEPROMs to enhance performance as well as decrease the per unit cost of the device.

For example, an improved EPROM is charged in a manner similar to the UVEPROM and erased in a manner similar to the EEPROM discussed above, typically referred to as a flash EEPROM. This improved type of EPROM is typically of smaller size than the traditional EPROM due to, inter alia, the arrangement of metal bit line contacts. As seen in FIGS. 1 and 2, a conventional improved EPROM array includes a series of metal bit lines which are formed so that each contacts the drain regions in one column of drain regions. The metal bit line-to-drain contacts, however, poses a significant challenge to further increasing the density of the array.

Typically, excess area between metal contacts and poly regions is generally required when forming the metal contacts to compensate for masking alignment error which may occur during the fabrication. This results in increased cell size. The metal bit line-to-drain contacts are formed by forming a contact mask over a layer of insulation material ILD to define a series of metal contact openings. The unmasked portions of the layer of insulation material ILD is etched to expose a portion of each of the drain regions. A layer of aluminum or tungsten (W) is deposited into the exposed drain region to form the metal bit line-to-drain contacts. Then, masking and etching of the layer of aluminum is performed to form each of the individual metal bit lines. Were the contact mask misaligned, the subsequent etching of the layer of insulation material ILD would expose a portion of the word line which could result in the floating gate and the word line shorting together, destroying the cell. To avoid this problem, the drain regions of the array are formed larger than otherwise would be necessary to avoid etching of the floating gate should mask misalignment occur.

U.S. Pat. Nos. 5,589,412 and 5,484,741 to Iranmanesh et al. and Bergemont, respectively, each discloses a method of increasing the density of a flash EPROM that utilizes a series of self-aligned intermediate strips of conductive material to form contacts to drain regions of field effect transistors (FETs). The aforementioned references disclose, in pertinent part, forming a plurality of stacked gate structures on a layer of gate dielectric material disposed over a substrate having the requisite doped regions to function as the source and drain of a field effect transistor (FET). A plurality of word lines are formed on field oxide regions, located within the substrate, as well as the stacked gate structures so that each word line is formed over and interconnects all of the stacked gate structures in one row of stacked gate structured. A layer of first insulation material is formed over each word line. A plurality of strips of second insulation materia are formed so that each strip of the second insulation material is formed over one common source bit line. A plurality of strips of spacer material are formed so that each strip of spacer material covers a portion of each drain region. A plurality of intermediate interconnect strips are formed over the strips of second insulation material, the strips of spacer material, the layers of first insulation material, and the drain regions to that each intermediate interconnect strip interconnects each drain region in one column of drain regions. A third layer in insulation material is formed over the strips of second insulation material, the strips of spacer material, the word lines, the substrate and the intermediate interconnect strips. The third layer of insulation material has a plurality of spaced-apart openings formed therein to expose portions of one intermediate interconnect strip. A drawback with the prior art attempts to increase the density of an EPROM array is that each after requires additional process steps which increases the cost of the device.

What is needed, therefore, is an improved method and apparatus that allows reducing the area required for forming contacts in an EPROM device without increasing the cost of producing the same.

SUMMARY OF THE INVENTION

The present invention provides an EPROM, a flash EPROM, an $E^2$PROM and a method for forming the same having increased density. The invention does so by reducing the area after required for formation of a contact. Specifically, a storage cell for electrically programmable read-only memory (EPROM) includes a pair of spaced-apart gate structures, with a double wall spacer structure disposed about each gate structure A dielectric region is disposed atop, and extends coextensive with, each of the pair of spaced apart gate structures. In this manner, a pair of spaced apart insulated gate structures may be formed with an intermetal dielectric layer positioned atop thereof. An aperture is formed in the intermetal dielectric layer so as to be in superimposition with a portion of each of the pair of insulated gate structures and a region of the substrate disposed therebetween. A metallic contact layer, including a plug portion, disposed within the aperture, is formed atop of the intermetal dielectric layer, forming a metallic contact.

The metallic contact is self-aligned with the exposed region of the substrate by the double wall spacer and the dielectric region. Preferably, the double wall spacer is produced by forming adjacent to each of the pair of spaced-apart gate structures and the dielectric region disposed thereon, a pair of silicon oxide sidewall spacers. Formed adjacent to each of the silicon oxide sidewall spacers is a silicon nitride sidewall spacer. The dielectric region is typically formed from silicon nitride, and the metal contact may be formed from any type of metal, including aluminum or tungsten. The pair of gate structures each includes a conductive control gate disposed between adjacent active regions in the substrate and spaced apart therefrom. Positioned between the control gate and the substrate is a conductive floating gate, with a dielectric layer disposed therebetween.

DETAILED DESCRIPTION OF THE SPECIFIC EMBODIMENTS

Figure 1:
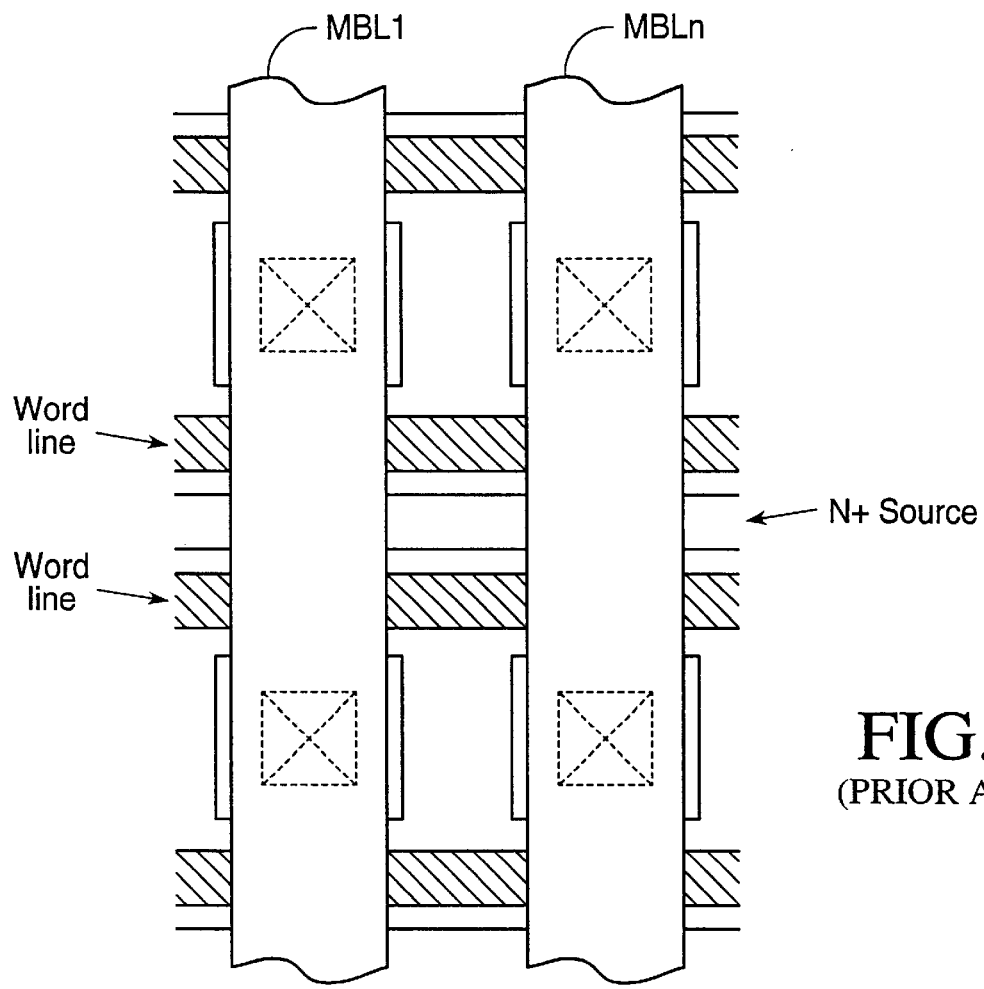
FIG. 1 is a plan diagram illustrating a portion of a flash EPROM array of the prior art.
Figure 2:
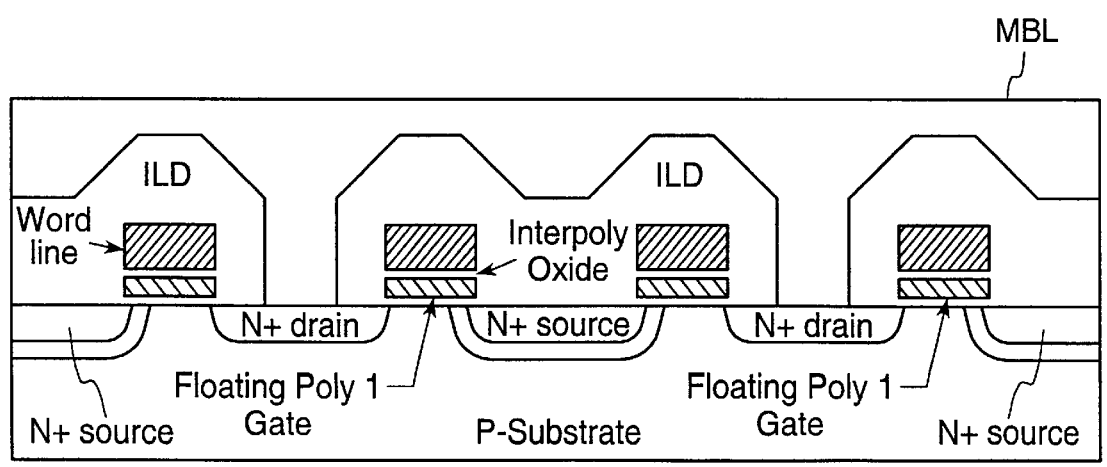
FIG. 2 is a cross-sectional diagram of the prior flash EPROM shown in FIG. 1 and taken along lines 2—2.
Figure 3:
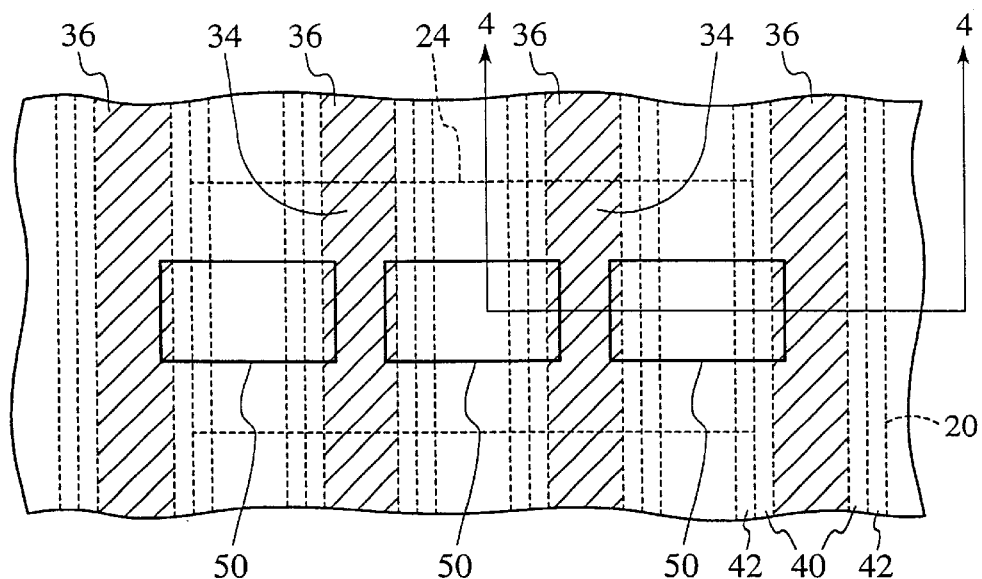
FIG. 3 is a simplified plane view of the EPROM is accord with the present invention.
Figure 4:
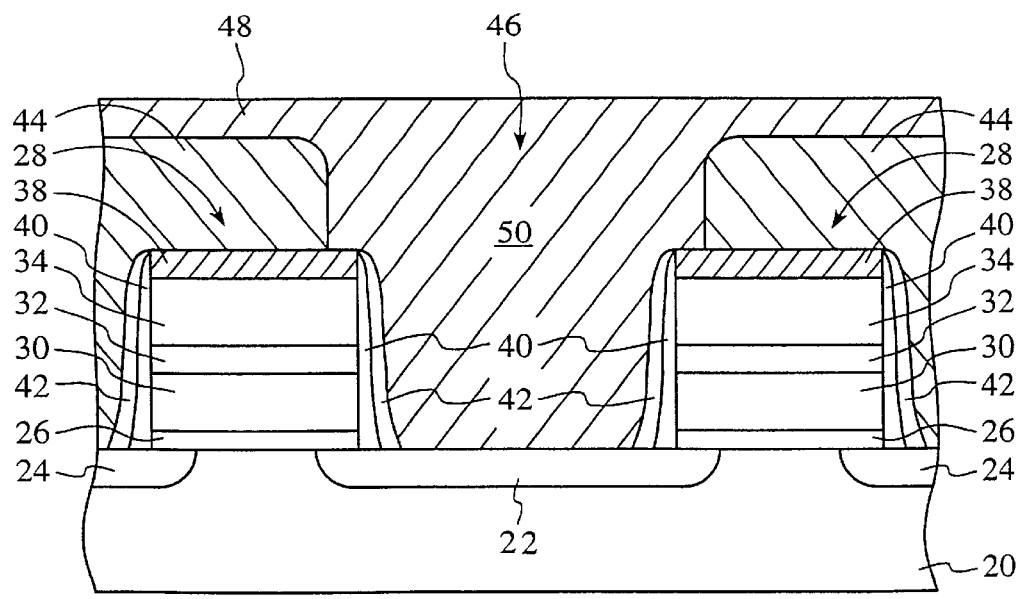
FIG. 4 is a simplified cross-sectional view of the EPROM shown in FIG. 3 and taken along lines 4—4.

Referring to FIGS. 3 and 4, the EPROM in accord with the present invention may be formed on a silicon substrate 20 that is composed of a P-type doped single crystalline silicon. A relatively thick Field OXide (FOX) 22 is formed on and in portions of the substrate surface surrounding and electrically isolating active devices areas 24. The field oxide 22 may be formed by the LOCal Oxidation of Silicon (LOCOS) method commonly practiced in the semiconductor industry. The LOCOS process includes of depositing, or thermally growing, a thin pad oxide (not shown) composed of silicon oxide on the substrate surface and then depositing a silicon nitride ($Si_3N_4$) layer (not shown), usually by chemical vapor deposition (CVD), with the nitride layer serving as a barrier to thermal oxidation. The silicon nitride layer is patterned leaving portions over the silicon substrate where active device regions are required semiconductor devices, such as field effect transistors. The silicon substrate is then subjected to an oxidizing ambient, such as steam oxidation, to form the relatively thick field oxide regions 22 composed of silicon dioxide ($SiO_2$) surrounding the active device areas 24. A portion of the field oxide naturally forms under the perimeter of the nitride layer by lateral oxidation of the silicon substrate and is commonly referred to, in the industry, as the "bird's beak" because of its shape.

After removing the silicon nitride layer, for example in a hot phosphoric acid solution, and the pad oxide in a dilute solution of hydrofluoric acid (HF), a FET gate oxide 26 is formed on the device areas 24 using thermal oxidation. A plurality of stacked gate structures 28 are formed. The stacked gate structures 28 are formed from a first layer of polysilicon 30 formed over the gate oxide disposed on device areas 24. A composite layer of oxide-nitride-oxide (ONO) 32 is formed over the first layer of polysilicon 30. Thereafter, a second layer of polysilicon 34 and word lines 36 are formed atop of the ONO layer 32. The first layer of polysilicon 30 functions as the floating gate of the cell, and the second layer of polysilicon 34 functions as the control gate. The polysilicon layers 30 and 34, as well as the word lines 36, are usually heavily doped with an N-type electrically conductive dopant, such as phosphorus (P) or arsenic (As) to provide low resistance.

Referring to FIG. 4, after formation of the stacked gate structures 28, an insulating layer 38, such as silicon nitride or a polycide, is formed atop of the second layer of polysilicon 34, by chemical vapor deposition and then etchback. Subsequent to the formation of the insulating layer 38, lightly N-type doped source/drain regions are formed in the active device areas 24, for example by ion implantation, adjacent to the gate electrodes 28. Thereafter, a sidewall insulating layer is deposited and anisotropically etched back forming first sidewall spacers 40 adjacent to both the stacked gate structure 28 and the insulating layer 38, forming an insulated stacked gate structure. A second sidewall insulating layer is deposited and anisotropically etched back forming second sidewall spacers 42 disposed adjacent to the insulated gate structure. This essentially completes the field effect transistors (FETs).

An intermetal dielectric layer 44 is formed over the insulated stacked gate structures 28 and the second sidewall spacers 42, and a contact apertures 46 is etched in the intermetal dielectric layer 44 to the active device areas 24 located between the stacked gate structures 28. The contact aperture 46 is typically formed by anisotropic etching using a patterned photo resist layer (not shown) etching mask. The first and second sidewall spacers 40 and 42, serve as an etch stop layer when the aperture 46 is formed.

A metal layer 48 is deposited over the intermetal dielectric layer that includes a plug portion 50 that fills the opening 46 to form a bit line contact. The width W of the contact aperture 46 is aligned within the active device areas 24 and is prevented from partially or completely lying outside the active device area 24. In this fashion, the bit line contacts are self-aligned to the drains of the memory cells as a result of the double wall spacer consisting of the first and second sidewall spacers 40 and 42. As a result, the excess area which is conventionally required to allow for misalignment is no longer necessitated.

Figure 5:
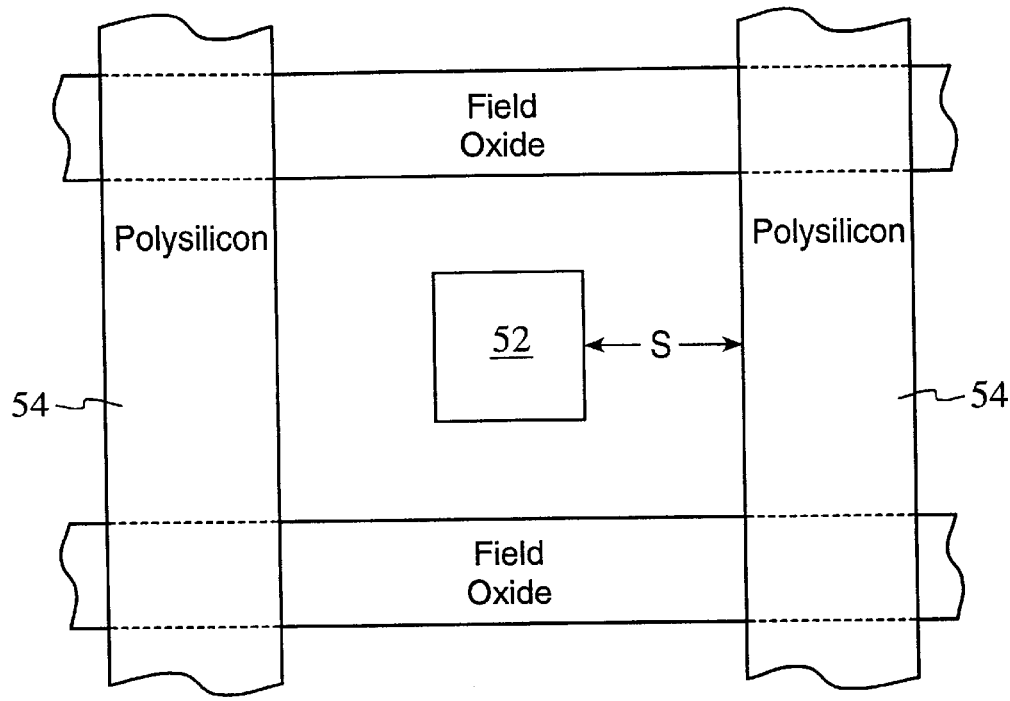
FIG. 5 is a detailed top plan view of an EPROM cell of the prior art.
Figure 6:
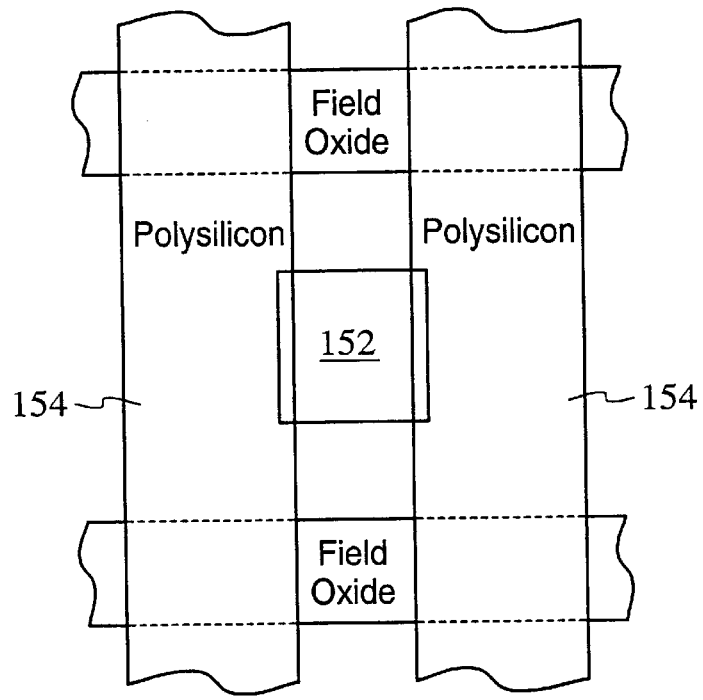
FIG. 6 is a detailed top plan view of an EPROM cell in accord with the present invention.

Referring to FIG. 5, conventional technology required each EPROM cell have a space "S" disposed between each bit line contact 52 and the polysilicon word lines 54 to avoid the problems with mask misalignment, discussed above. With the present invention, the spacing between the self-aligned bit line contact 152, shown more clearly in FIG. 6, and the polysilicon word lines 154 may be avoided, allowing overlap. In this fashion, the minimum spacing between the bit line contact 152 and the polysilicon word lines 154 is defined by the contact resistance and process technology.

Further, providing the double sidewall spacers, shown in FIG. 4, formed from two differing materials provides the added benefit to significantly decrease the cell size by approximately 33%.

Although the foregoing invention has been described with respect to memory cells formed from stacked gate structures, it applies equally well with respect to split gate cells. The scope of the invention should, therefore, be determined not with reference to the above description, but instead should be determined with reference to the appended claims along with their full scope of equivalents.

What is claimed is:

1. A method of forming a contact hole on a storage cell for electrically programmable read-only memory of the type having spaced-apart gate structures, said method comprising:

forming a dielectric region atop a subset of said spaced-apart gate structures, said dielectric region having two side regions;

forming adjacent to said subset of spaced-apart gate structures and said dielectric region disposed thereon, a first sidewall spacer, wherein said first sidewall spacer covers at least a part of said two side regions;

forming adjacent to said first sidewall spacer, a second sidewall spacer, defining spaced-apart insulated gate structures, said second sidewall spacer having a height that is generally equal to a height of said first sidewall spacer;

depositing atop of said spaced-apart insulated gate structures, an intermetal dielectric layer; and forming an aperture in said intermetal dielectric layer, with said aperture being positioned so as to be in superimposition with a portion of each of said insulated gate structures including said first and second sidewall spacers, and a region of said substrate disposed therebetween.

2. The method as recited in claim 1 further including:

depositing a metallic contact layer atop of said intermetal dielectric layer, said metallic contact layer including a plug portion disposed within said aperture, said metallic contact layer including said plug portion deposited in a single step.

3. The method as recited in claim 1 wherein said dielectric region is formed from silicon.

4. The method as recited in claim 1 wherein said first sidewall spacer is formed from silicon oxide and said second sidewall spacer is formed from silicon nitride.

5. The method as recited in claim 2 wherein said metallic contact layer is formed from aluminum.

6. The method as recited in claim 2 wherein said metallic contact layer is formed from tungsten.

7. The method as recited in claim 1 wherein said gate structures each includes a conductive floating gate disposed between adjacent active regions and spaced apart from said substrate, a control gate spaced apart from said floating gate and a dielectric layer disposed between said floating gate and said control gate.

8. The method as recited in claim 7 wherein said floating gate and said control gate are each formed from polysilicon.

9. A method of forming a contact on a storage cell for electrically programmable read-only memory of the type having a plurality of spaced-apart polysilicon gate structures, said method comprising:

forming a silicon nitride region atop of a subset of said plurality of spaced-apart gate structures, said silicon nitride region having two side regions;

forming adjacent to each of the gate structures of said subset said silicon nitride region disposed thereon, silicon oxide sidewall spacer, wherein said silicon oxide sidewall spacer covers at least a part of said two side regions;

forming adjacent to said silicon oxide sidewall spacer, a silicon nitride sidewall spacer while leaving the silicon nitride region atop the spaced apart gate structures exposed, thereby insulating the gate structures of said subset, defining insulated gate structures;

depositing atop of said insulated gate structures, an intermetal dielectric layer;

forming an aperture in said intermetal dielectric layer, with said aperture being positioned so as to be in superimposition with a portion of each of said insulated gate structures including said first and second sidewall spacers, and a region of said substrate disposed therebetween; and depositing a metallic contact layer atop of said intermetal dielectric layer, said metallic contact layer including a plug portion disposed within said aperture, said metallic contact layer including said plug portion deposited in a single step.

10. The method as recited in claim 9 wherein said metallic contact layer including said plug portion is formed from aluminum.

11. The method as recited in claim 9 wherein said metallic contact layer including said plug portion is formed from tungsten.

12. The method as recited in claim 9 wherein said insulated gate structures each includes a conductive floating gate disposed between adjacent active regions and spaced apart from said substrate, a control gate spaced apart from said floating gate and a dielectric layer disposed between said floating gate and said control gate.

13. The method as recited in claim 12 wherein said floating gate and said control gate are each formed from polysilicon.

14. A method for applying self-align contact technology to an electrically programmable read-only memory device, said method comprising:

receiving a semiconductor substrate having said electrically programmable read-only device thereon, wherein said electrically programmable read-only memory device includes a plurality of spaced-apart gate structures and first spacers adjoined at the side of a subset of said plurality of spaced-apart gate structures;

depositing a dielectric layer above said semiconductor substrate, said dielectric layer having two side regions, wherein said first spacers cover at least a part of said two side regions;

applying a spacer etching process to form second spacers adjoined with said first spacers, said first and said second spacers having a generally equal height, wherein said second spacers remain associated with said first spacers and can be an etching protection mask in a subsequently applied self-aligned contact process.

15. The method as recited in claim 14 wherein said electrically programmable read-only memory device includes a memory cell formed from a stacked gate structure.

16. The method as recited in claim 14 wherein said electrically programmable read-only memory device includes a memory cell formed from a split-gate structure.

17. The method as recited in claim 14 wherein said dielectric is a nitride.

18. The method as recited in claim 14 wherein said dielectric is an oxynitride.

19. The method as recited in claim 14 further including, subsequent to said applying said spacer etching process, of forming a self-aligned contact.

20. The method as recited in claim 19 wherein said self-aligned contact is formed from a refractory metal.

\* \* \* \* \*

UNITED STATES PATENT AND TRADEMARK OFFICE
CERTIFICATE OF CORRECTION

PATENT NO. : 6,255,205 B1
DATED : July 3, 2001
INVENTOR(S) : Kuo-Tung Sung

It is certified that error appears in the above-identified patent and that said Letters Patent is hereby corrected as shown below:

<u>Column 6,</u>
Lines 1-5, should read -- forming adjacent to each of the gate structures of said subset said silicon nitride region disposed thereon, a silicon oxide sidewall spacer, wherein said silicon oxide sidewall spacer covers at least a part of said two side regions; --

Signed and Sealed this

Seventh Day of June, 2005

JON W. DUDAS
*Director of the United States Patent and Trademark Office*